United States Patent
Nakaya et al.

(10) Patent No.: US 10,279,485 B2
(45) Date of Patent: May 7, 2019

(54) ROBOT SYSTEM AND METHOD OF DETECTING DEFORMATION OF END EFFECTOR

(71) Applicant: KAWASAKI JUKOGYO KABUSHIKI KAISHA, Kobe-shi, Hyogo (JP)

(72) Inventors: Atsushi Nakaya, Akashi (JP); Hiroyuki Okada, Kakogawa (JP); Masaya Yoshida, Himeji (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 181 days.

(21) Appl. No.: 15/538,938

(22) PCT Filed: Dec. 22, 2014

(86) PCT No.: PCT/JP2014/006394
§ 371 (c)(1),
(2) Date: Jun. 22, 2017

(87) PCT Pub. No.: WO2016/103292
PCT Pub. Date: Jun. 30, 2016

(65) Prior Publication Data
US 2018/0015620 A1    Jan. 18, 2018

(51) Int. Cl.
*G05B 15/00* (2006.01)
*G05B 19/00* (2006.01)
(Continued)

(52) U.S. Cl.
CPC .......... *B25J 15/106* (2013.01); *B25J 9/1674* (2013.01); *B25J 9/1692* (2013.01);
(Continued)

(58) Field of Classification Search
CPC ...... B25J 11/0095; B25J 15/106; B25J 19/00; B25J 19/06; B25J 19/063; B25J 9/1674;
(Continued)

(56) References Cited

U.S. PATENT DOCUMENTS 9,972,523 B2 *  5/2018  Hashimoto ....... H01L 21/67778
10,002,781 B2 *  6/2018  Moura .............. H01L 21/67265
(Continued)

FOREIGN PATENT DOCUMENTS

JP    H01-257593 A    10/1989
JP    H09-070780 A    3/1997
(Continued)

OTHER PUBLICATIONS

Dec. 24, 2018 Office Action issued in Chinese Patent Application No. 201480084253X.
(Continued)

*Primary Examiner* — Harry Y Oh
(74) *Attorney, Agent, or Firm* — Oliff PLC (57) ABSTRACT

A robot system includes a robotic arm having a wrist in a tip-end part thereof, the wrist being rotatable on a rotational axis extending in a given direction, an end effector attached to the wrist, and a deformation detecting device configured to detect deformation of the end effector by using a target pin having a target part where a given detection part of the end effector reaches. The target part has an indicate function to indicate that the detection part reaches the target part. The deformation detecting device includes a search part configured to control the robotic arm so that the detection part touches the target pin to search for the target part, and detect that the detection part reaches the target part based on the indicate function, and a deformation detecting part configured to compare an assumed position of the detection part when the detection part reaches the target part with a given
(Continued)

reference position, and detect the deformation of the end effector.

18 Claims, 7 Drawing Sheets

(51) Int. Cl.
    *B25J 15/10*     (2006.01)
    *B25J 9/16*     (2006.01)
    *B25J 11/00*     (2006.01)
    *B25J 19/06*     (2006.01)
    *H01L 21/67*     (2006.01)
    *H01L 21/677*     (2006.01)

(52) U.S. Cl.
    CPC ......... *B25J 11/0095* (2013.01); *B25J 19/063* (2013.01); *H01L 21/67259* (2013.01); *H01L 21/67288* (2013.01); *H01L 21/67736* (2013.01); *H01L 21/67742* (2013.01)

(58) Field of Classification Search
    CPC .............. B25J 9/1692; H01L 21/67259; H01L 21/67288; H01L 21/67736; H01L 21/67742
    See application file for complete search history.

(56) References Cited

U.S. PATENT DOCUMENTS

| 2001/0020199 A1* | 9/2001 | Bacchi | B25J 9/042 |
| | | | 700/245 |
| 2009/0093908 A1* | 4/2009 | Hashimoto | B25J 9/1692 |
| | | | 700/258 |
| 2011/0118873 A1* | 5/2011 | Hashimoto | B25J 9/1692 |
| | | | 700/245 |

FOREIGN PATENT DOCUMENTS

| JP | H11-179692 A | 7/1999 |
| JP | H11-216565 A | 8/1999 |
| JP | 2009-090406 A | 4/2009 |
| JP | 2010-188437 A | 9/2010 |
| WO | 2009/072199 A1 | 6/2009 |

OTHER PUBLICATIONS

Apr. 7, 2015 Search Report issued in International Patent Application No. PCT/JP2014/006394.

Jun. 27, 2017 International Preliminary Report on Patentability issued in International Patent Application No. PCT/JP2014/006394.

\* cited by examiner

ROBOT SYSTEM AND METHOD OF DETECTING DEFORMATION OF END EFFECTOR

TECHNICAL FIELD

The present invention relates to a method of detecting deformation of an end effector, and a robot system which implements the method.

BACKGROUND ART

Conventionally, in order to convey wafers which are material of substrates for semiconductor devices, wafer conveyance robots equipped with a fork-shaped end effector at a tip end of a robotic arm have been used. This end effector is a thin-plate-shaped robotic hand, of which a root part is cantilevered by a wrist of the robotic arm. Thus, the end effector may be bent by its own weight or the weight of the substrate which is placed thereon.

Further, particularly in the wafer conveyance robot, a work space of the end effector may be restricted narrowly and, thus, the end effector may interfere with other objects. In addition, for example, mechanical troubles, such as backlash of gears, elongation of belts, and gear-tooth jumps, may occur in the robotic arm and the end effector. Due to these causes, when vibration and/or an impact are/is applied to the end effector, a level position offset and/or distortion may occur to the end effector.

The end effector which is deformed as described above may not be able to securely convey the wafer. Therefore, it is desirable to detect the deformation of the end effector before starting the conveyance work. Conventionally, a deformation detection work of the end effector accompanied by disassembly of the device was conducted periodically by workers; however, in recent years, various technologies to automatically detect the deformation of the end effector have been proposed.

For example, Patent Document 1 discloses a substrate conveying device provided with an irradiation part which is provided to a tip-end part of a robotic hand and irradiates light in parallel with an extending direction of the robotic hand, and an offset amount detecting part which receives the light and detects an offset between a light-receiving position and a reference position.

For example, Patent Document 2 discloses a robot which is provided with four range-finding sensors at a robotic hand, and is configured to calculate distortion of the robotic hand based on a parallelism obtained by comparing distances from the surface of a level block, which are measured by the range-finding sensors, with reference values.

Moreover, for example, Patent Document 3 discloses a robot which is configured so that an optical sensor disposed just beside a tip-end part of a robotic hand which is located at reference coordinates irradiates detection light to the robotic hand and receives the light, and if an output of the optical sensor is abnormal, the hand is considered to be deformed and the operation of the robot is then stopped.

REFERENCE DOCUMENTS OF CONVENTIONAL ART

Patent Documents

[Patent Document 1] WO2009/072199A1
[Patent Document 2] JP2010-188437A
[Patent Document 3] JP1999-179692A

DISCLOSURE OF THE INVENTION

Problems to be Solved by the Invention

In the technologies of Patent Documents 1-3, a plurality of contactless sensors for exclusive use (i.e., there is no other usage) are provided for detecting the deformation of the end effector. Since such technologies require many sensors, wiring and maintenance of the sensors become complicated.

Thus, the present invention proposes a technology to detect deformation of an end effector using a robotic arm having a conventional structure, without using any contactless sensor for exclusive use.

SUMMARY OF THE INVENTION

According to one aspect of the present invention, a robot system is provided, which includes a robotic arm having a wrist in a tip-end part thereof, the wrist being rotatable on a rotational axis extending in a given direction, an end effector attached to the wrist, and a deformation detecting device configured to detect deformation of the end effector using a target pin having a target part where a given detection part of the end effector reaches, the target part having an indicate function to indicate that the detection part reaches the target part. The deformation detecting device includes a search part configured to control the robotic arm so that the detection part touches the target pin to search for the target part, and detect that the detection part reaches the target part based on the indicate function, and a deformation detecting part configured to compare an assumed position of the detection part when the detection part reaches the target part with a given reference position, and detect the deformation of the end effector.

According to another aspect of the present invention, a method of detecting deformation of an end effector is provided in a robot system including a robotic arm having a wrist in a tip-end part thereof, the wrist being rotatable on a rotational axis extending in a given direction, the end effector attached to the wrist, and a deformation detecting device, the deformation detecting device detecting the deformation of the end effector using a target pin having a target part where a given detection part of the end effector reaches, the target part having an indicate function to indicate that the detection part reaches the target part. The method includes controlling the robotic arm so that the detection part touches the target pin to search for the target part, detecting that the detection part reaches the target part based on the indicate function, and comparing an assumed position of the detection part when the detection part reaches the target part with a given reference position to detect the deformation of the end effector.

Effect of the Invention

According to the present invention, the deformation of the end effector is detectable using the target pin and the conventional robotic arm.

MODES FOR CARRYING OUT THE INVENTION

Figure 1:
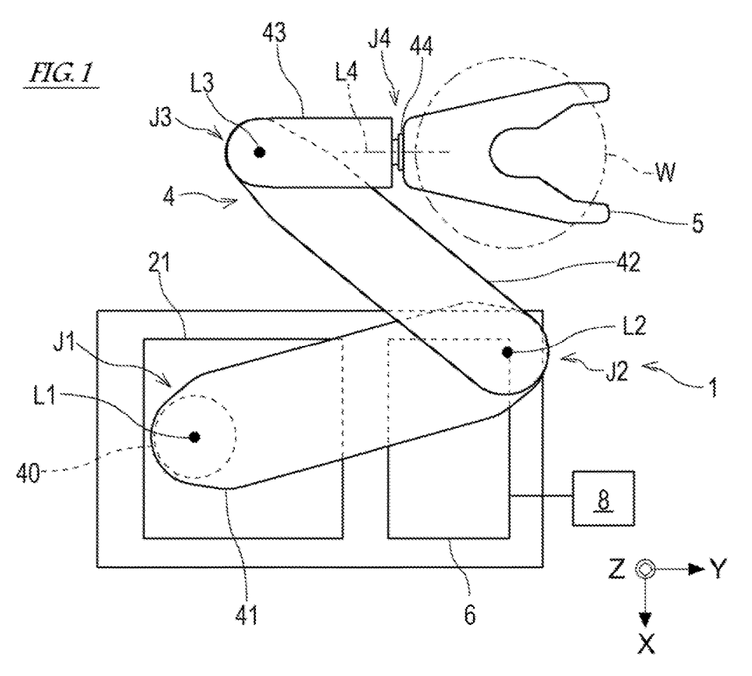
FIG. 1 is a plan view schematically illustrating a structure of a robot system according to one embodiment of the present invention.
Figure 2:
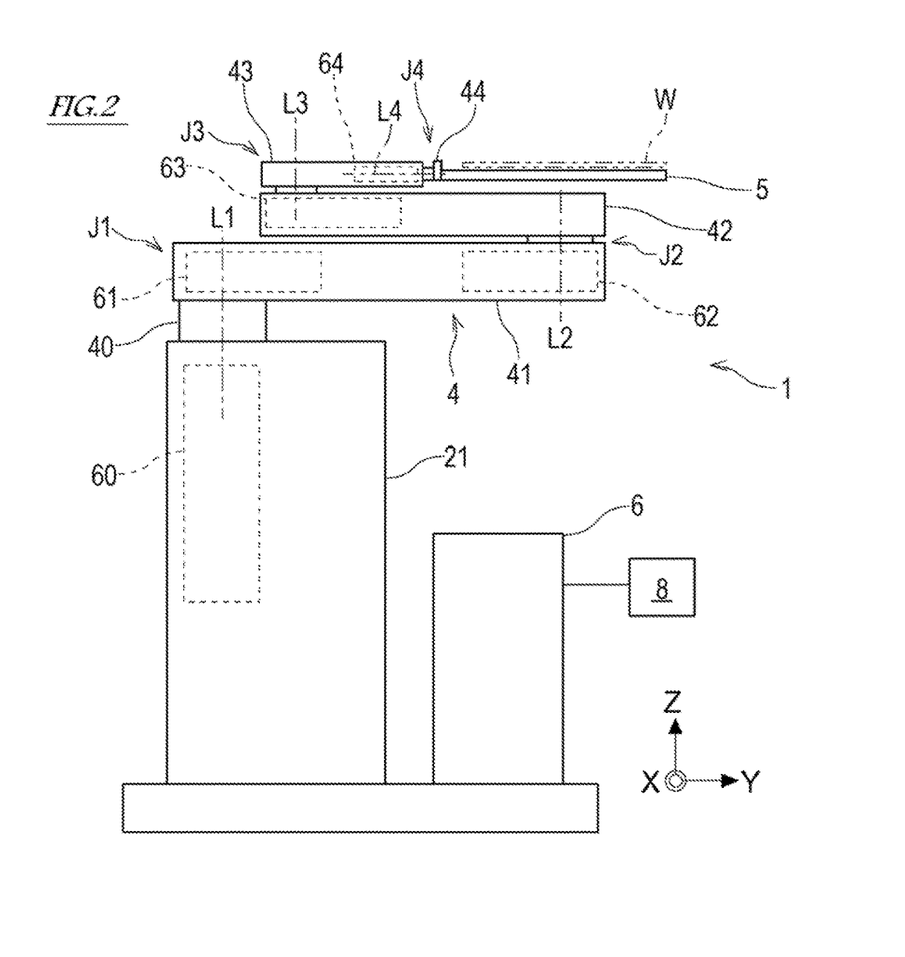
FIG. 2 is a side view schematically illustrating the structure of the robot system illustrated in FIG. 1.
Figure 3:
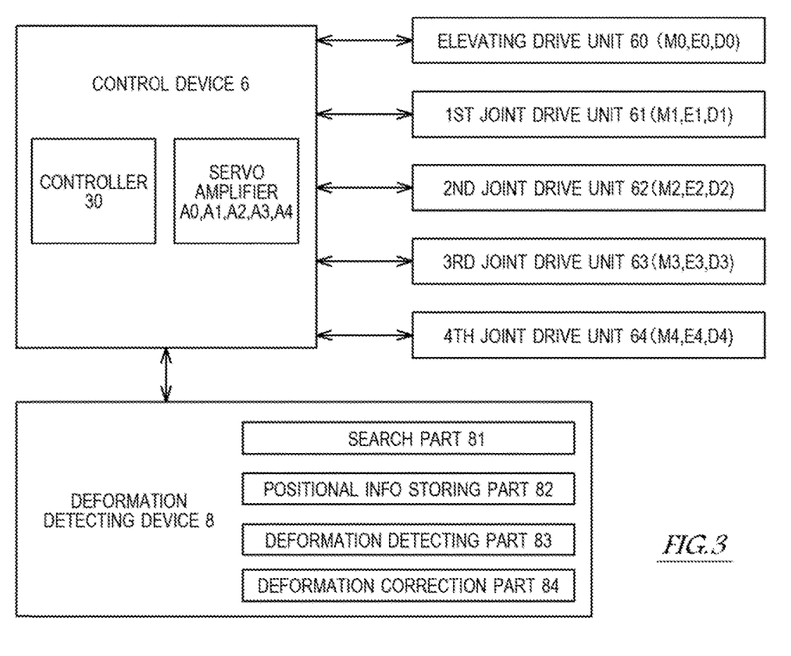
FIG. 3 is a view illustrating a configuration of a control system of the robot system illustrated in FIG. 1.

Next, embodiments of the present invention are described with reference to the accompanying drawings. Below, the present invention is described, while being applied to a wafer conveyance robot system for conveying a disc-shaped wafer. Note that the robot system to which the present invention is applicable is not limited to the wafer conveyance robot system. FIG. 1 is a plan view schematically illustrating a structure of a robot system 1 according to one embodiment of the present invention, FIG. 2 is a side view schematically illustrating the structure of the robot system 1 illustrated in FIG. 1, and FIG. 3 is a view illustrating a configuration of a control system of the robot system 1 illustrated in FIG. 1. In this specification and the claims, a certain horizontal direction is referred to as "X-direction," a direction substantially perpendicular to the X-direction is referred to as "Y-direction," and a vertical direction is referred to as "Z-direction."

As illustrated in FIGS. 1 and 2, the robot system 1 according to one embodiment of the present invention includes a robotic arm 4, a robotic hand 5 (hereinafter, simply referred to as "the hand 5") which is one example of an end effector attached to a hand part of the robotic arm 4, a control device 6 which controls operation of the robotic arm 4, and a deformation detecting device 8 which detects deformation of the hand 5. Moreover, a target pin 9 having a target part TG is used for the deformation detection of the hand 5 by the robot system 1. Hereinafter, each element of the robot system 1 is described in detail.

First, the robotic arm 4 is described. The robotic arm 4 according to this embodiment is structured as a horizontally articulated robot which is supported by a pedestal 21. Note that the robotic arm 4 is not limited to the horizontally articulated robot, but may be a vertically articulated robot.

The robotic arm 4 includes an elevatable shaft 40 which is provided so as to stand from the pedestal 21, a first link 41 coupled to the elevatable shaft 40 via a first joint J1, a second link 42 coupled to a tip-end part of the first link 41 via a second joint J2, a third link 43 coupled to a tip-end part of the second link 42 via a third joint J3, and a fourth link 44 coupled to a tip-end part of the third link 43 via a fourth joint J4. An extending direction of each axis of a first axis L1 which is a rotational axis of the first joint J1, a second axis L2 which is a rotational axis of the second joint J2, and a third axis L3 which is a rotational axis of the third joint J3 is the Z-direction. Moreover, a fourth axis L4 which is a rotational axis of the fourth joint J4 penetrates through the third link 43 in its extending direction, and is substantially perpendicular to the Z-direction.

In the robotic arm 4 having the structure described above, a wrist is formed by a mutually-jointed body comprised of the third joint J3, the third link 43, the fourth joint J4, and the fourth link 44. The fourth link 44 is provided with a mechanical interface to which the hand 5 is detachably attached. The hand 5 which is the end effector according to this embodiment is a robotic hand having a fork-shaped flat plate where a disc-shaped wafer W is placed. Although not illustrated, the hand 5 is provided with a gripper which grips the wafer W placed on the fork-shaped flat plate, and its drive mechanism.

The elevatable shaft 40 is driven so as to ascend and descend, or expand and contract in the Z-directions by an elevating drive unit 60. The elevating drive unit 60 is comprised of a servo motor M0, a position detector E0, and a power transmission mechanism D0 which transmits power of the servo motor M0 to the elevatable shaft 40.

The first to fourth joints J1-J4 are provided with first to fourth joint drive units 61-64 which rotate the joints J1-J4 on their rotational axes, respectively. The joint drive units 61-64 are comprised of servo motors M1-M4, position detectors E1-E4, power transmission mechanisms D1-D4 which transmit power of the servo motors M1-M4 to the corresponding links, respectively. The power transmission mechanisms D1-D4 are, for example, gear transmission mechanisms with a gear-reduction mechanism, respectively. Each of the position detectors E0-E4 is comprised of a rotary encoder, for example. Each of the servo motors M0-M4 is drivable independently. When the servo motors M0-M4 drive, rotational positions of output shafts of the servo motors M0-M4 are detected by the position detectors E0-E4, respectively.

Operation of the robotic arm 4 is controlled by the control device 6. As illustrated in FIG. 3, the control device 6 includes a controller 30, and servo amplifiers A0-A4 corresponding to the servo motors M0-M4, respectively. The control device 6 performs a servo control in which the hand 5 attached to the wrist of the robotic arm 4 is moved along an arbitrary path into an arbitrary attitude (spatial position and posture).

The controller 30 is a so-called computer, and for example, includes an arithmetic processor, such as a micro controller, CPU, MPU, PLC, DSP, ASIC, or FPGA, and a memory, such as ROM or RAM (none is illustrated). The memory stores program(s) which are executed by the arithmetic processor, various fixed data, etc. The memory also stores teaching point data for controlling the operation of the robotic arm 4, data related to the shape and dimension of the robotic hand 5, data related to the shape and dimension of the wafer W held by the robotic hand 5, etc. In the controller 30, the arithmetic processor reads and executes software, such as the program, stored in the memory to control the operation of the robot system 1. Alternatively, the controller 30 may perform the processing by a centralized control with a single computer, or may perform the processing by a distributed control with a collaboration of a plurality of computers.

The controller 30 calculates a target attitude after a given control period of time based on the rotational positions detected by the position detectors E0-E4, the corresponding attitude of the hand 5, and the teaching point data stored in the memory. The controller 30 outputs control instructions (positional instructions) to the servo amplifiers A0-A4, respectively so that the hand 5 takes the target attitude after the given control period of time. The servo amplifiers A0-A4 supply driving electric power to the servo motors M0-M4 based on the control instructions, respectively. Thus, the hand 5 is movable to take a desired attitude.

Next, the deformation detecting device 8 is described. The deformation detecting device 8 is a so-called computer, and includes an arithmetic processor and a memory (none is illustrated). The memory stores program(s) which are executed by the arithmetic processor(s), and various fixed data, etc. The memory also stores teaching point data to be used for deformation detection processing, such as initial starting positions described later, data related to the shape and dimension of the hand 5, and detection parts SP described later, and data related to the shape and dimension of the target pin 9, and the target part TG, etc. The deformation detecting device 8 is connected with the control device 6 so that transmission and reception of information therebetween are possible. Note that, although in this embodiment the control device 6 and the deformation detecting device 8 of the robotic arm 4 are provided as independent arithmetic units, the control device 6 may also combinedly have the function of the deformation detecting device 8.

The deformation detecting device 8 having the configuration described above can function as a search part 81, a positional information storing part 82, a deformation detecting part 83, and a deformation correction part 84, by the arithmetic processor(s) reading and executing the software, such as the program(s), stored in the memory. The search part 81 controls the robotic arm 4 so that the given detection part SP of the hand 5 touches the target pin 9 to search the target part TG, and detects that the detection part SP reaches the target part TG based on an indicate function of the target part TG. The positional information storing part 82 acquires and stores positional information (assumed position) of the detection part SP when the detection part SP reaches the target part TG. The deformation detecting part 83 reads and compares Z-direction positional information stored in the positional information storing part 82 and reference positional information stored beforehand in the positional information storing part 82 to detect deformation of the hand 5. When the deformation of the hand 5 is detected by the deformation detecting part 83, the deformation correction part 84 determines whether the deformation is correctable by an adjustment of at least one of the position and posture of the robotic arm 4, and if the deformation is correctable, it then corrects the deformation.

Here, the deformation detection processing (a method of detecting the deformation) of the hand 5 which is the end effector using the robot system 1 having the above structure is described. Note that, the deformation detecting device 8 performs the deformation detection processing and, in the following, although not explicitly described in particular, the control of the robotic arm 4 by the deformation detecting device 8 is performed via the controller 30 (control device 6).

Figure 4:
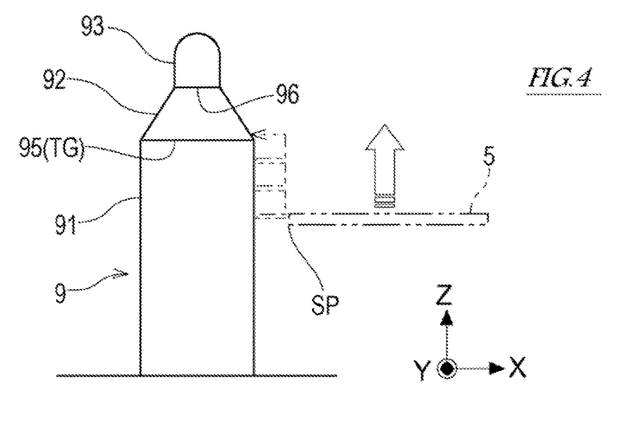
FIG. 4 is a side view of a target pin according to one embodiment.

Upon beginning the deformation detection processing of the hand 5, the target pin 9 is installed beforehand within an operable range of the hand 5. FIG. 4 is a side view of the target pin 9 according to one embodiment. As illustrated in FIG. 4, the target pin 9 according to one embodiment is a pillar-shaped body extending in the Z-direction, and has a pencil shape as a whole. The target pin 9 is integrally formed with a first constant diameter part 91 of a circular cylindrical shape with a constant diameter, a varying diameter part 92 of a truncated-cone shape in which the diameter varies, and a second constant diameter part 93 of a circular cylindrical shape with a constant diameter. The first constant diameter part 91, the varying diameter part 92, and the second constant diameter part 93 are arranged in this order in the Z-direction. The diameter of the first constant diameter part 91 is larger than the diameter of the second constant diameter part 93, and the first constant diameter part 91 is smoothly connected with the second constant diameter part 93 via the varying diameter part 92 which is gradually reduced in the diameter. Note that the target pin 9 may have a shape comprised of the first constant diameter part 91 and the varying diameter part 92, from which the second constant diameter part 93 is omitted.

The target pin 9 has such a shape that a touched position of the hand 5 to the target pin 9 changes locally when the hand 5 is moved along the target pin 9 in the Z-direction while touching the surface of the target pin 9, and this shaped part is used as the target part TG. This target part TG has the indicate function which indicates that the detection part of the hand 5 described later reaches the target part TG. That is, the detection part of the hand 5 reaching the target part TG is configured to be detectable if the detection part of the hand 5 touches the target part TG.

An annular boundary line 95 exists between the first constant diameter part 91 and the varying diameter part 92 of the target pin 9, and an annular boundary line 96 also exists between the varying diameter part 92 and the second constant diameter part 93. The touched position of the hand 5 to the target pin 9 changes locally in the XY-directions at the boundary lines 95 and 96. Therefore, one of the boundary lines 95 and 96 (boundary line 95) of the target pin 9 is used as the target part TG in this embodiment.

Figure 6:
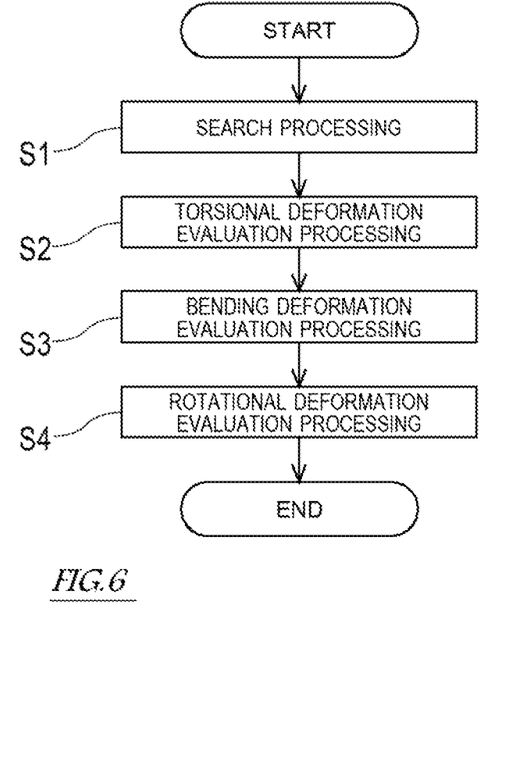
FIG. 6 is a flowchart of deformation detection processing of the end effector according to one embodiment of the present invention.

FIG. 6 is a flowchart of the deformation detection processing of the end effector according to one embodiment of the present invention. As illustrated in FIG. 6, when the deformation detection processing begins, the deformation detecting device 8 first performs search processing (Step S1).

Figure 5:
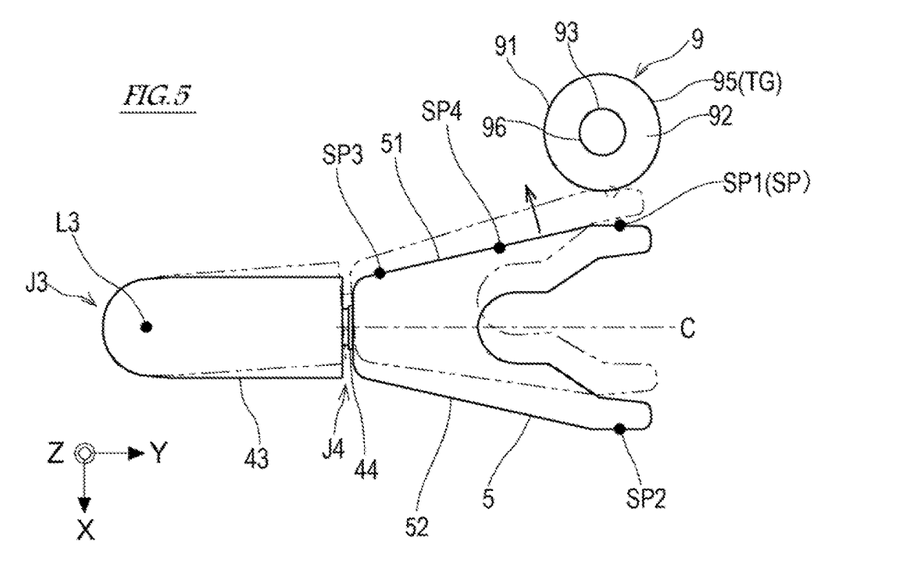
FIG. 5 is a plan view illustrating a situation of the target pin and an end effector at the time of search processing.

FIG. 5 is a plan view illustrating a situation of the target pin 9 and the robotic hand 5 at the time of search processing. As illustrated in FIG. 5, the flat-plate-shaped hand 5 has the fork shape, when seen in Z-direction, in which a root side is single part and a tip-end side is branched into two parts, and has a contour shape symmetrical with respect to a hand centerline C. Below, in order to facilitate the description, in the outer circumferential surface of the hand 5 which forms the contour shape of the hand 5, one of side faces via the hand centerline C is referred to as a "first side face 51" and the other side face is referred to as a "second side face 52." The first detection part SP1 is defined in the first side face 51 at the tip end side of the hand 5. In addition, the second detection part SP2 is defined in the second side face 52 at the tip end side of the hand 5. The first detection part SP1 and the second detection part SP2 are desirable to be disposed at symmetrical positions via the hand centerline C. Alternatively, the first detection part SP1 and the second detection part SP2 may be defined in an inner side-face part of the fork shape of the hand 5. A third detection part SP3 is defined in the first side face 51 at the root side of the hand 5. A fourth detection part SP4 is defined in the first side face 51 between the first detection part SP1 and the third detection part SP3.

In the search processing (Step S1), similar processings are repeated for each of the first to fourth detection parts SP1-SP4 of the hand 5. Thus, the search processing when the first detection part SP1 of the hand 5 is used as the detection part SP is described in detail, and detailed description of the search processings when the second to fourth detection parts SP2-SP4 are used as the detection parts SP is omitted.

Figure 7:
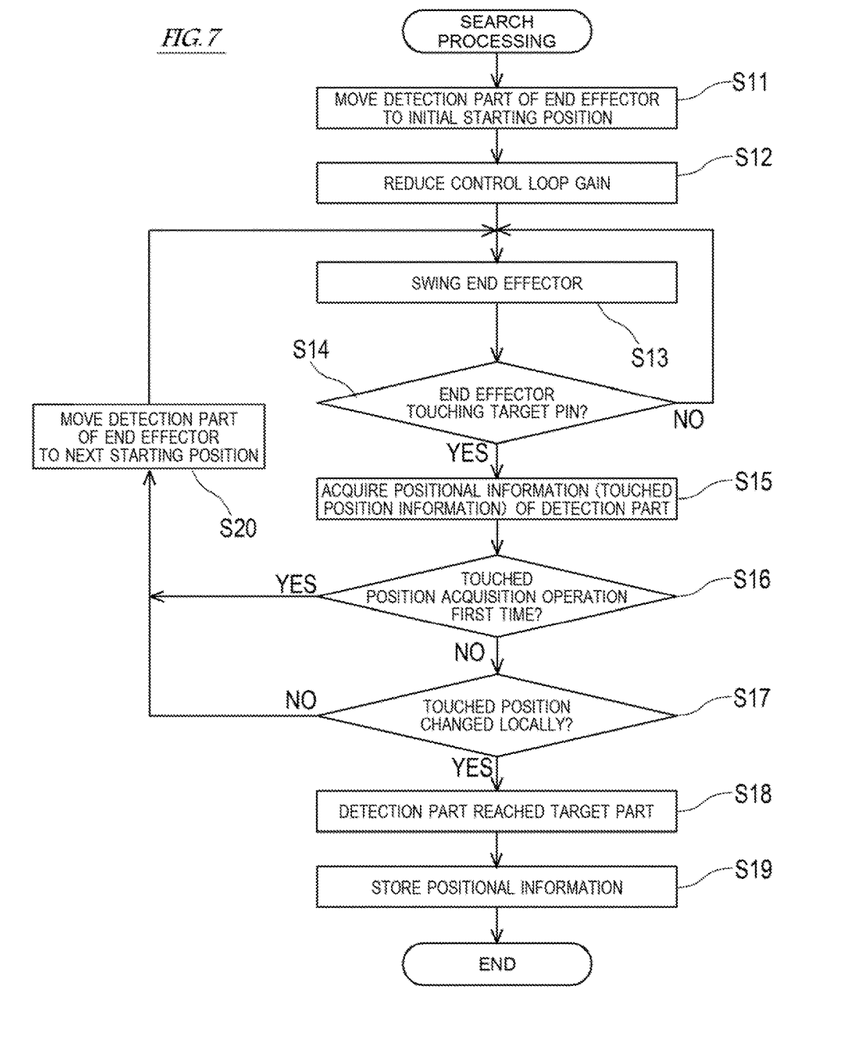
FIG. 7 is a flowchart of the search processing.

FIG. 7 is a flowchart of the search processing. As illustrated in FIG. 7, when the search processing begins, the deformation detecting device 8 controls the robotic arm 4 so that the detection part SP of the hand 5 moves to the initial starting position taught beforehand (Step S11). The initial starting position is located so that its Z-direction position is on the first constant diameter part 91 side from the target part TG (boundary line 95), and its XY-position is separated from the surface of the first constant diameter part 91 of the target pin 9 by a minute distance. When the detection part SP moves to the initial starting position, the hand 5 is not touching the target pin 9 in principle.

Next, the deformation detecting device 8 reduces a control loop gain of the third joint drive unit 63 to a given value or below (Step S12). The given value is selected from a value smaller than the control loop gain at the time of a conveyance operation of the wafer W. The control loop gain includes a position loop gain and a speed loop gain. By reducing the control loop gain, a correction effect of the servo control loop becomes weaker and a response becomes slower. As a result, the hand 5 can touch the target pin 9 with a small pressing force.

In the above, the control loop gain of the third joint drive unit 63 is desirable to be substantially zero. The phrase that the control loop gain of the third joint drive unit 63 is made "substantially zero" means that the control loop gain is changed to a small value including zero from a servo gain for normal operation to minimize a contact reaction force at the time of applying an external force to the third joint drive unit 63, i.e., at the time of the hand 5 contacting the target pin 9, and the servo motor M3 of the third joint drive unit 63 becomes into a state where an angle position thereof is substantially and freely displaceable, without resisting to the contact reaction force. The phrase also includes cutting the control loop gain to make it zero.

In addition to the reduction of the control loop gain of the third joint drive unit 63, the pressing force of the hand 5 against the target pin 9 may be reduced by lowering an upper limit of drive current (i.e., an upper limit of a driving torque). Note that the reduction of the control loop gain and the reduction of the upper limit of the drive current may be performed before the hand 5 reaches the initial starting position.

Next, the deformation detecting device 8 controls the robotic arm 4 to perform a series of touched position acquisition operations (Steps S13-S15) at the initial starting position. The touched position acquisition operations are described below. In the series of touched position acquisition operations, the hand 5 first swings horizontally (Step S13). Specifically, the hand 5 is caused to swing by a minute amplitude by operating the first joint J1 and the second joint J2 of the robotic arm 4 without moving the third joint J3 and the fourth joint J4 (Step S13).

As the hand 5 swings, the detection part SP of the hand 5 touches the target pin 9. When the hand 5 touches the target pin 9, since the control loop gain of the third joint drive unit 63 is substantially zero, the hand 5 displaces angularly on the third axis L3. The angular displacement is transmitted to the servo motor M3 via the power transmission mechanism D3 to angularly displace the servo motor M3. Then, the hand 5 touching the target pin 9 is detected based on the servo motor M3 beginning to angularly displace.

If the hand 5 touching the target pin 9 is detected (YES at Step S14), the deformation detecting device 8 acquires the positional information (touched position information) of the detection part SP when the hand 5 touches the target pin 9 (Step S15). The touched position information includes a position of a wrist reference point (a given point on the third axis L3) of the robotic arm 4 and an orientation of the wrist, for example. The positional information on the wrist reference point of the robotic arm 4 is acquirable from the position detectors E0, E1, and E2 of the servo motors M0, M1, and M2 of the elevating drive unit 60, the first joint drive unit 61, and the second joint drive unit 62, respectively. The information related to the orientation of the wrist of the robotic arm 4 is acquirable from the position detectors E3 and E4 of the servo motors M3 and M4 of the third joint drive unit 63 and the fourth joint drive unit 64, respectively.

Subsequently, if the touched position acquisition operation is the first time (YES at Step S16), the deformation detecting device 8 controls the robotic arm 4 to move the detection part SP of the hand 5 to a next starting position (Step S20). The next starting position of the detection part SP of the hand 5 is located at a position moved toward the varying diameter part 92 from the initial starting position in the Z-direction by a given minute value. The deformation detecting device 8 then controls the robotic arm 4 to perform the series of touched position acquisition operations (Steps S13-S15) from the next starting position.

At Step S16, if the touched position acquisition operation is the second or later time (NO at Step S16), the deformation detecting device 8 determines whether the detection part SP reaches the target part TG based on the touched position information acquired in the current touched position acquisition operation and the touched position information acquired in the previous touched position acquisition operation. At the target part TG, the touched position of the hand 5 to the target pin 9 changes locally in the XY-directions. Thus, the deformation detecting device 8 determines whether the detection part SP reaches the target part TG based on the local change in the XY-directions between the touched position information acquired currently and the touched position information acquired previously.

Specifically, if the touched position of the hand 5 to the target pin 9 changes locally in the XY-directions (YES at Step S17), the deformation detecting device 8 determines that the detection part SP reaching the target part TG is detected (Step S18). Specifically, the deformation detecting device 8 determines that the detection part SP reaching the target part TG is detected if the angular displacement on the third axis L3 derived from the touched position information acquired currently and the touched position information acquired previously exceeds a given threshold. The deformation detecting device 8 then stores the touched position information acquired currently as the positional information on the target part TG (Step S19), and ends the search processing. Note that the positional information on the target part TG is an assumed position of the detection part SP when the detection part SP reaches the target part TG.

On the other hand, if the touched position of the hand 5 to the target pin 9 has not changed locally in the XY-directions (NO at Step 17), the deformation detecting device 8 determines that the detection part SP has not reached the target part TG, and controls the robotic arm 4 so that the hand 5 moves to a further next starting position (Step S20). The further next starting position is located at a position moved toward the varying diameter part 92 from the next starting position in the Z-direction by the given minute value. Thus, the deformation detecting device 8 controls the robotic arm 4 to repeat the series of touched position acquisition operations (Steps S13-S15) while moving the starting position little by little toward the varying diameter part 92 in the Z-direction until the detection part SP reaching the target part TG is detected.

Returning to the flowchart of FIG. 6, the deformation detecting device 8 evaluates deformation of the hand 5 (Steps S2-S4) based on the positional information on the target parts TG which are searched for each of the first to fourth detection parts SP1-SP4 of the hand 5 by the search processing. In this embodiment, the deformation of the hand 5 is evaluated for each of torsional deformation, bending deformation, and rotational deformation. Since the deformation detecting device 8 repeats similar deformation evaluation processing for each of the deformations, the evaluation processing for the torsional deformation of the hand 5 is described below in detail and, thus, detailed description of the evaluation processings for the bending deformation and the rotational deformation is omitted.

Figure 8:
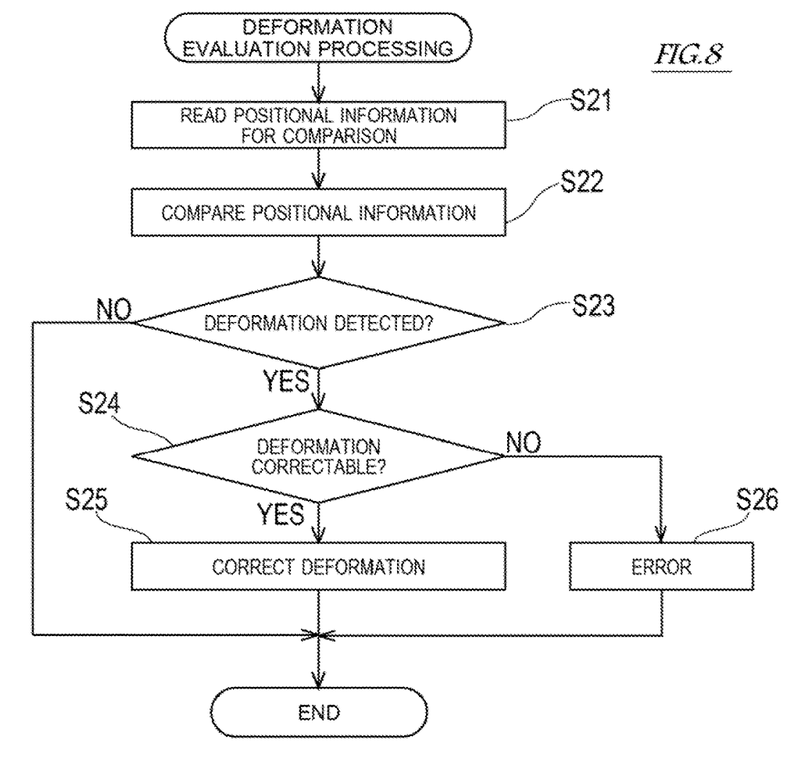
FIG. 8 is a flowchart of evaluation processing of one modification.

FIG. 8 is a flowchart of the deformation evaluation processing. As illustrated in FIG. 8, the deformation detecting device 8 first reads from the positional information storing part 82 the positional information which is to be used in order to detect the deformation (Step S21). The positional information to be read includes the acquired positional information on the target part TG and the given reference positional information. The Z-direction positional information may be Z-direction positional information on the wrist reference point of the robotic arm 4 contained in the acquired positional information, for example.

In this embodiment, the reference positional information is the positional information on the target part TG obtained by performing the search processings at the different detection parts SP on the hand 5 (reference positions). The positional information to be used in order to detect the torsional deformation are the positional information on the target part TG obtained by searching for the target part TG at the first detection part SP1, and the positional information on the target part TG obtained by searching for the target part TG at the second detection part SP2. The positional information to be used in order to detect the bending deformation are the positional information on the target part TG obtained by searching for the target part TG at the first detection part SP1, and the positional information on the target part TG obtained by searching for the target part TG at the third detection part SP3. The positional information to be used in order to detect the rotational deformation are the positional information on the target part TG obtained by searching for the target part TG at the third detection part SP3, and the positional information on the target part TG obtained by searching for the target part TG at the fourth detection part SP4. Note that, if the rotational deformation is to be detected, the positional information on the target part TG obtained by searching for the target part TG at the first detection part SP1 may be used, alternatively or additionally at the fourth detection part SP4.

Next, the deformation detecting device 8 compares the two read positional information (Step S22). At Step S22, if the deformations to be detected are the torsional deformation and the bending deformation, the Z-direction positional information of the two read positional information are compared. If, among the two positional information on the target part TG, a difference between one of the Z-direction positional information and the other Z-direction positional information is below the given threshold, the deformation detecting device 8 determines that there is no deformation or little deformation (NO at Step S23), and ends the deformation evaluation processing. On the other hand, if the difference between one of the Z-direction positional information contained in the two read positional information on the target part TG and the other Z-direction positional information exceeds the given threshold, the deformation detecting device 8 determines that the deformation of the end effector is detected (YES at Step S23).

Alternatively, at Step S22, if the deformation to be detected is the rotational deformation, the positional information in the XY-directions (in the XY plane) on the two read positional information are compared. When detecting the rotational deformation, it is desirable to control the position and posture of the robotic arm 4 so that an extending direction of the hand centerline C which is defined in parallel with the fourth axis L4 becomes parallel with the Y-direction. Since the hand 5 according to this embodiment has a coupling part between the third link 43 and the fourth link 44, the hand 5 may not be linearly symmetrical with respect to the hand centerline C due to coupling errors of the coupling part. In addition, if the hand 5 collides with other objects, the extending direction of the hand centerline C may not become parallel with the Y-direction due to rotational deformation thus caused in the hand 5 on the third axis L3. For example, the deformation detecting device 8 is detectable of such rotational deformation by performing as follows. That is, an inclination with respect to the Y-direction of a straight line (evaluation straight line) which connects the third detection part SP3 to the fourth detection part SP4 of the hand 5 before deformation (reference inclination) is stored, the inclination with respect to the Y-direction of the evaluation straight line is calculated based on the acquired positional information in the XY-directions on the third detection part SP3 and the acquired positional information in the XY-directions on the fourth detection part SP4, the calculated inclination is compared with the reference inclination. If the difference exceeds a given threshold, the deformation detecting device 8 determines that the rotational deformation of the end effector is detected (YES at Step S23), and on the other hand, if the difference is below the given threshold, the deformation detecting device 8 determines that there is no deformation (NO at Step S23).

If the deformation of the end effector is detected, the deformation detecting device 8 determines whether the deformation is correctable by an adjustment of at least one of the position and posture of the robotic arm 4 (Step S24). The determination of whether the deformation is correctable is made based on, for example, a degree of the deformation which is derived from the difference between the two read positional information, whether any axis which is necessary to correct the deformation exists in the robotic arm 4, etc.

If the deformation detecting device 8 determines that the deformation is correctable (YES at Step S24), it creates deformation correction information for causing the control device 6 to correct the deformation and outputs the deformation correction information to the control device 6 (Step S25), and ends the deformation evaluation processing. Note that in the robotic arm 4 of the embodiment, the torsional deformation is correctable by rotating the hand 5 on the fourth axis L4. Since the robotic arm 4 according to this embodiment is not provided with an axis of which the bending deformation is correctable, the bending deformation is not correctable. In the robotic arm 4 according to this embodiment, the rotational deformation is correctable by rotating the hand 5 on the third axis L3 so that the calculated inclination of the evaluation straight line becomes the reference inclination, and adjusting the XY-direction positions.

On the other hand, if the deformation detecting device 8 determines that the deformation is not correctable (NO at Step S24), it performs error processing (Step S26), and ends the deformation evaluation processing. In the error processing, the deformation detecting device 8 gives an alarm and causes the control device 6 to stop the motion of the robotic arm 4, for example.

As described above, the deformation detecting device 8 performs the torsional deformation evaluation processing (Step S2), the bending deformation evaluation processing (Step S3), and the rotational deformation evaluation processing (Step S4), and ends the deformation detection processing of the end effector.

As described above, the robot system 1 according to this embodiment includes the robotic arm 4 having, in the tip-end part, the wrist which is rotatable on the rotational axis (the third axis L3) extending in the given direction, the hand 5 which is the end effector attached to the wrist, and the deformation detecting device 8 which detects the deformation of the end effector by using the target pin 9 having the target part GT where the given detection part SP of the hand 5 reaches. The target part TG of the target pin 9 has the indicate function which indicates that the detection part SP of the hand 5 reaches the target part TG. The deformation detecting device 8 includes the search part 81 which controls the robotic arm 4 so that the detection part SP of the hand 5 touches the target pin 9 to search for the target part TG, and detects that the detection part SP reaches the target part TG based on the indicate function of the target part TG, and the deformation detecting part 83 which compares the positional information on the detection part SP (assumed positional information) when the detection part SP reaches the target part TG with the reference positional information to detect the deformation of the hand 5.

Moreover, the method of detecting a deformation of the end effector according to this embodiment described above is a method in which, in the robot system 1, the deformation detecting device 8 detects the deformation of the hand 5 by using the target pin 9, and the method includes causing the deformation detecting device 8 to control the robotic arm 4 so that the detection part SP touches the target pin 9 and search for the target part TG; causing the deformation detecting device 8 to detect that the detection part SP reaches the target part TG based on the indicate function of the target part TG; and causing the deformation detecting device 8 to compare the positional information on the detection part SP when the detection part SP reaches the target part TG with the given reference positional information and detect the deformation of the end effector.

According to the robot system 1 and the method of detecting the deformation of the end effector described above, the deformation of the end effector is detectable by using the target pin 9 provided within the operable range of the end effector. In the conventional technology disclosed in Patent Documents 1-3, the contactless sensors for exclusive use are provided to the robot system in order to detect the deformation of the robotic hand. On the other hand, in the robot system 1 according to this embodiment, the deformation of the end effector is detectable by using the target pin 9 and the robotic arm 4 having the conventional structure, without using the contactless sensors which require special wiring and controls.

In addition, in the robot system 1 and the method of detecting the deformation of the end effector according to this embodiment, the target part TG of the target pin 9 is formed in such a shape in order to demonstrate the indicate function, that the touched position of the hand 5 to the target pin 9 changes locally when the hand 5 is moved in the Z-direction along the target pin 9 while touching the target pin 9. The deformation detecting device 8 controls the robotic arm 4 so that the detection part SP of the hand 5 is moved in the Z-direction along the target pin 9 while touching the target pin 9, and searches for the target part TG. The deformation detecting device 8 detects that the detection part SP reaches the target part TG based on the local change in the touched position of the detection part SP with respect to the target pin 9.

More specifically, as the shape in which the touched position of the hand 5 to the target pin 9 changes locally, the target pin 9 has the constant diameter part 91 with the constant diameter and the varying diameter part 92 with the varying diameter which are continuously formed in the given direction, and the target part TG is comprised of the boundary (boundary line 95) between the constant diameter part 91 and the varying diameter part 92. The deformation detecting device 8 acquires the positional information (touched position information) of the detection part SP when the detection part SP touches the target pin 9 while swinging the hand 5 on the third axis L3, and the acquisition is carried out at the plurality of locations while displacing the hand 5 toward the varying diameter part 92 from the constant diameter part 91 in the Z-direction to search for the target part TG, and detects that the detection part SP reaches the target part TG based on the angular displacement on the third axis L3 which is derived from the plurality of acquired touched position information.

According to such a robot system 1 and method of detecting the deformation of the end effector, the detection part SP reaching the target part TG is detectable based on the change in the diameter between the constant diameter part 91 and the varying diameter part 92 of the target pin 9. Such an indicate function of the target part TG of the target pin 9 is achieved by the contour shape of the target pin 9, which is a comparatively simple structure and does not need wiring and control for this function.

In the robot system 1 and the method of detecting the deformation of the end effector according to this embodiment, when the deformation of the hand 5 is detected, the deformation detecting device 8 determines whether the deformation is correctable by an adjustment of at least one of the position and posture of the robotic arm 4, and when the deformation is correctable, the deformation detecting device 8 corrects the deformation.

According to such a robot system 1 and method of detecting the deformation of the end effector, the deformation of the end effector is correctable, without stopping or disassembling the robotic arm 4. Therefore, the frequency of stopping the robotic arm 4 is reducible and, thus, the productivity can be increased.

In the robot system 1 and the method of detecting the deformation of the end effector according to this embodiment, the reference positional information is the assumed positional information on the reference part when the deformation detecting device 8 controls the robotic arm 4 so that the reference part which is different from the detection part SP of the hand 5 touches the target pin 9 to search for the target part TG, and detects that the reference part reaches the target part TG based on the indicate function of the target part TG. That is, the search processing is performed for the reference part which is different from the detection part SP of the hand 5, and the positional information on the reference part when the reference part reaches the target part TG is used as the reference positional information.

In the above embodiment, when the torsional deformation of the hand 5 is to be detected, the first detection part SP1 which is the tip-end part of the hand 5 and is defined at one side with respect to the hand centerline C, and the second detection part SP2 defined at the other side are used as the detection part and the reference part, respectively. Then, the deformation detecting device 8 detects the torsional deformation of the hand 5 by comparing the assumed position of the detection part SP in the Z-direction when the detection part SP reaches the target part TG, with the assumed position of the reference part in the Z-direction when the reference part reaches the target part TG.

Moreover, in the above embodiment, when the bending deformation of the hand 5 is to be detected, one of the detection part and the reference part is used as the first detection part SP1 which is defined in the tip-end part of the hand 5, and the other is used as the third detection part SP3 which is defined in the root part of the hand 5. Then, the deformation detecting device 8 detects the bending deformation of the hand 5 by comparing the assumed position of the detection part SP in the Z-direction when the detection part SP reaches the target part TG with the assumed position of the reference part in the Z-direction when the reference part reaches the target part TG.

Furthermore, in the above embodiment, when the rotational deformation of the hand 5 is to be detected, one of the detection part and the reference part is used as the third detection part SP3 which is defined in the root part of the hand 5, and the other is used as the fourth detection part SP4 which is defined in the tip-end part or between the tip-end part and the root part of the hand 5. Then, the deformation detecting device 8 detects the rotational deformation of the hand 5 by comparing the assumed position of the detection part SP in the XY plane when the detection part SP reaches the target part TG with the assumed position of the reference part in the XY plane when the reference part reaches the target part TG.

According to the robot system 1 and the method of detecting the deformation of the end effector as described above, since the positional information acquired by performing the search processing for each of the two detection parts SP (the detection part and the reference part) of the hand 5 is compared, the deformation of the end effector is detectable without being influenced by the deformation, the positional offset, etc. of the target position TG of the target pin 9.

Although one suitable embodiment of the present invention is described above, the configuration of the robot system 1 may be modified as follows.

For example, the end effector according to the above embodiment is, but not limited to, the hand 5 of the fork shape for wafer conveyance. For example, the end effector may be any one of a general-purpose hand equipped with a plurality of grippers, an adsorption pad, a nut tightener, a welding gun, and a spray gun.

Moreover, in the search processing according to the above embodiment, the hand 5 is rotated (swung) on the third axis L3 extending in the Z-direction, but the swing direction of the end effector is not limited to the direction.

For example, if the robotic arm is a vertically articulated robot, the end effector may be rotated during the search processing on a rotational axis extending in the X-direction or the Y-direction. In this case, the target pin 9 is disposed so that the extending direction of the target pin 9 is parallel with the rotational axis of the end effector extending direction.

For example, the end effector may be displaced in the Z-direction, with the end effector hardly being rotated during the search processing. Since the robot system 1 according to the above embodiment is the wafer conveyance robot, scarping of the hand 5 and the target pin 9 must be avoided as much as possible to prevent generation of particles.

However, in situations in which contacting and scraping of the target pin 9 and the end effector are not restricted, the search of the target part TG may be performed by displacing the target pin 9 in the Z-direction while contacting the detection part SP, without rotating the end effector.

Moreover, although the reference positional information according to the above embodiment is, but not limited to, the Z-direction positional information acquired by performing the search processing at another detection part SP (reference part) defined in the hand 5.

For example, the reference positional information may be positional information on the detection part SP which is not deformed, when the deformation detecting device 8 controls the robotic arm 4 so that the non-deformed detection part SP of the end effector touches the target pin 9 to search for the target part TG, and detects that the non-deformed detection part SP reaches the target part TG based on the indicate function of the target part TG. That is, the reference positional information may be the positional information on the target part TG obtained by performing the search processing at the non-deformed detection part SP on the end effector. By using such reference positional information, the deformation of the hand 5 is detectable by comparing the positional information on the target part TG at which the detection part SP is searched before and after the deformation.

For example, the reference positional information may be positional information on the target part TG of the target pin 9. However, since the target pin 9 in this case is precisely positioned in the coordinate system which the robot system 1 has, it is restricted to a condition where there is no deformation and movement of the target pin 9.

Moreover, in the target pin 9 according to the above embodiment, the boundary line 95 between the first constant diameter part 91 and the varying diameter part 92 is used as the target part TG, and the local change in the outer diameter of the first constant diameter part 91 and the varying diameter part 92 constitutes the indicate function, but the target pin 9 is not limited to the shape. The target pin 9 may have the shape in which the touched position of the end effector to the target pin 9 changes locally when the end effector is moved in the Z-direction along the target pin 9 while touching the target pin 9.

Figure 9:
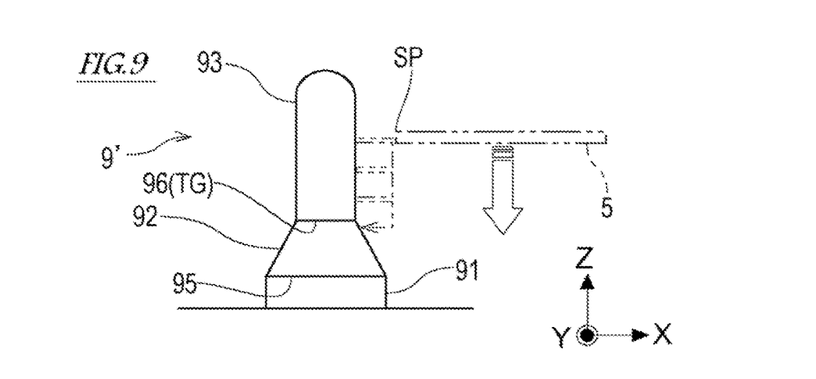
FIG. 9 is a side view of a target pin according to another embodiment of the present invention.

For example, the boundary line 96 between the varying diameter part 92 and the second constant diameter part 93 of the target pin 9 may be used as the target part TG, and the local change in the XY-position of the outer shapes of the varying diameter part 92 and the second constant diameter part 93 may constitute the indicate function. In this case, as illustrated in FIG. 9, during the search processing, the initial starting position of the detection part SP of the end effector may be on the circumferential surface of the second constant diameter part 93 of a target pin 9', and the series of touched position acquisition operations (Steps S13-S15) is repeated at a plurality of locations while moving the end effector in the Z-direction toward the varying diameter part 92 from the second constant diameter part 93.

For example, the target pin 9 may be of a circular cylindrical shape having a constant diameter and an upper edge of the target pin 9 may be used as the target part TG so that local change in the XY-position of the outer shape of the target pin 9 constitutes the indicate function. In this case, the detection part SP reaching the target part TG is detectable when the detection part SP of the end effector no longer touches the target pin 9.

Note that, although in this embodiment the indicate function of the target part TG is achieved by the shape of the target pin 9, the indicate function may be achieved by other ways. For example, the target pin 9 may be of a circular cylindrical shape having a constant diameter and a contact sensor is provided at the target part TG on the circumferential surface of the target pin 9 so that the indicate function is constituted by the contact sensor.

Moreover, in the above embodiment, although the deformation detecting device 8 performs the evaluation processing (Steps S2-S4) sequentially for the torsional deformation, the bending deformation, and the rotational deformation of the hand 5, at least one or more of the evaluation processings for the deformations may selectively be performed. For example, only the evaluation processing for the torsional deformation may be performed among the evaluation processings for the torsional deformation, the bending deformation and the rotational deformation of the hand 5. In this case, the search processings at the detection parts SP of the third detection part SP3 and the fourth detection part SP4 are unnecessary. Moreover, the order of the evaluation processing (Steps S2-S4) for each deformation is not limited to the order of the above embodiment and may suitably be interchanged.

From the above description, it is apparent for a person skilled in the art that many improvements and other embodiments of the present invention are possible. Therefore, the above description is to be interpreted only as illustrations, and is only provided in order to teach the person skilled in the art a best mode to implement the present invention. Details of the structures and/or the functions may substantially be changed, without departing from the spirit of the present invention.

DESCRIPTION OF REFERENCE CHARACTERS

1: Robot System
3: Control Device
4: Robotic Arm
5: Robotic Hand (End Effector)
8: Deformation Detecting Device
9: Target Pin
21: Pedestal
30: Controller
40: Elevatable Shaft
41-44: First to Fourth Links
60-64: Drive Unit
81: Search Part
82: Positional Information Storing Part
83: Deformation Detecting Part
84: Deformation Correction Part
91: First Constant Diameter Part
92: Varying Diameter Part
93: Second Constant Diameter Part
95, 96: Boundary Line
A0-A4: Servo Amplifier
C: Hand Centerline
D0-D4: Power Transmission Mechanism
E0-E4: Position Detector
J1-J4: First to Fourth Joints
L1-L4: First to Fourth Axes
M0-M4: Servo Motor
SP: Detection Part
TG: Target Part

What is claimed is:

1. A robot system, comprising:
a robotic arm having a wrist in a tip-end part thereof, the wrist being rotatable on a rotational axis extending in a given direction;
an end effector attached to the wrist; and
a deformation detecting device configured to detect deformation of the end effector by using a target pin having a target part where a detection area of the end effector reaches, the target having an indicate function to indicate that the detection area reaches the target, and
the deformation detecting device including:
a processor configured to:
control the robotic arm so that the detection part touches the target pin to search for the target part, and detect that the detection part reaches the target part based on the indicate function; and
compare an assumed position of the detection part when the detection part reaches the target part with an assumed position of a reference part when the reference part reaches the target part, and detect the deformation of the end effector.

2. The robot system of claim 1, wherein,
the target part is formed, in order to demonstrate the indicate function, in a shape in which a touched position of the end effector to the target pin changes locally, when the end effector is moved along the target pin in the given direction, while touching the target pin,
the deformation detecting device controls the robotic arm so that the detection part is moved along the target pin in the given direction while touching the target pin, to search for the target part, and
the deformation detecting device detects that the detection part reaches the target part based on a local change in the touched position of the detection part to the target pin.

3. The robot system of claim 1, wherein,
the target pin is formed, as the shape where the touched position of the end effector to the target pin changes locally, to continuously have a constant diameter part with a constant diameter and a varying diameter part with a varying diameter in the given direction, and a boundary between the constant diameter part and the varying diameter part constitutes the target part,
the deformation detecting device acquires positional information on the detection part when the detection part touches the target pin while swinging the end effector on the rotational axis,
the deformation detecting device performs the acquisition at a plurality of locations while displacing the end effector toward the varying diameter part from the constant diameter part in the given direction to search for the target part, and
the deformation detecting device detects that the detection part reaches the target part based on an angular displacement on the rotational axis derived from the plurality of positional information acquired.

4. The robot system of claim 1, wherein the deformation detecting device is configured to, when the deformation of the end effector is detected, determine whether the deformation is correctable by an adjustment of at least one of the position and posture of the robotic arm, and correct the deformation when the deformation is correctable.

5. The robot system of claim 1, wherein the reference position is, when the deformation detecting device controls the robotic arm so that the reference part that is different from the detection part of the end effector touches the target pin to search for the target part, and detects that the reference part reaches the target part based on the indicate function, an assumed position of the reference part.

6. The robot system of claim 5, wherein,
the deformation of the end effector is torsional deformation of the end effector, the detection part and the reference part are defined in tip-end parts of the end effector, and on one side and the other side of the centerline of the end effector, and the deformation detecting device compares the assumed position of the detection part in the given direction when the detection part reaches the target part with the assumed position of the reference part in the given direction when the reference part reaches the target part to detect the deformation of the end effector.

7. The robot system of claim 5, wherein, the deformation of the end effector is bending deformation of the end effector, one of the detection part and the reference part is defined in the tip-end part of the end effector, and the other is defined in a root part of the end effector, and the deformation detecting device compares the assumed position of the detection part in the given direction when the detection part reaches the target part with the assumed position of the reference part in the given direction when the reference part reaches the target part to detect the deformation of the end effector.

8. The robot system of claim 5, wherein, the deformation of the end effector is rotational deformation of the end effector, one of the detection part and the reference part is defined in a root part of the end effector, and the other is defined in the tip-end part of the end effector or between the tip-end part and the root part of the end effector, and the deformation detecting device compares the assumed position of the detection part in a plane perpendicular to the given direction when the detection part reaches the target part with the assumed position of the reference part in the plane perpendicular to the given direction when the reference part reaches the target part to detect the deformation of the end effector.

9. The robot system of claim 1, wherein the reference position is the assumed position of the detection part that is not deformed, when the deformation detecting device controls the robotic arm so that the non-deformed detection part of the end effector touches the target pin to search for the target part, and detects that the non-deformed detection part reaches the target part based on the indicate function.

10. A method of detecting deformation of an end effector in a robot system comprising a robotic arm having a wrist in a tip-end part thereof, the wrist being rotatable on a rotational axis extending in a given direction, the end effector attached to the wrist, and a deformation detecting device, the deformation detecting device detecting the deformation of the end effector by using a target pin having a target part where a given detection part of the end effector reaches, the target part having an indicate function to indicate that the detection part reaches the target part, the method comprising:

controlling, using a computer, the robotic arm so that the detection part touches the target pin to search for the target part;

detecting that the detection part reaches the target part based on the indicate function; and comparing an assumed position of the detection part when the detection part reaches the target part an assumed position of a reference part when the reference part reaches the target part to detect the deformation of the end effector.

11. The method of claim 10, wherein, the target part is formed, in order to demonstrate the indicate function, in a shape in which a touched position of the end effector to the target pin changes locally, when the end effector is moved along the target pin in the given direction, while touching the target pin, the searching for the target part includes controlling the robotic arm so that the detection part is moved along the target pin in the given direction while touching the target pin, to search for the target part, and the detecting that the detection part reaches the target part includes detecting that the detection part reaches the target part based on a local change in the touched position of the detection part to the target pin.

12. The method of claim 10, wherein, the target pin is formed, as the shape where the touched position of the end effector to the target pin changes locally, to continuously have a constant diameter part with a constant diameter and a varying diameter part with a varying diameter in the given direction, and a boundary between the constant diameter part and the varying diameter part constitutes the target part, the searching for the target part includes acquiring positional information on the detection part when the detection part touches the target pin while swinging the end effector on the rotational axis, the acquisition being performed at a plurality of locations while displacing the end effector toward the varying diameter part from the constant diameter part in the given direction to search for the target part, and the detecting that the detection part reaches the target part includes detecting that the detection part reaches the target part based on an angular displacement on the rotational axis derived from the plurality of positional information acquired.

13. The method of claim 10, further comprising determining by the deformation detecting device, when the deformation of the end effector is detected, whether the deformation is correctable by an adjustment of at least one of the position and posture of the robotic arm, and correcting the deformation when the deformation is correctable.

14. The method of claim 10, wherein the reference position is, when the target part is searched while a reference part that is different from the detection part of the end effector touches the target pin, and the reference part reaching the target part is detected based on the indicate function of the target part, an assumed position of the reference part.

15. The method of claim 14, wherein, the deformation of the end effector is torsional deformation of the end effector, the detection part and the reference part are defined in tip-end parts of the end effector, and on one side and the other side of the centerline of the end effector, and the detecting the deformation of the end effector includes comparing the assumed position of the detection part in the given direction when the detection part reaches the target part with the assumed position of the reference part in the given direction when the reference part reaches the target part to detect the deformation of the end effector.

16. The method of claim 14, wherein, the deformation of the end effector is bending deformation of the end effector, one of the detection part and the reference part is defined in the tip-end part of the end effector, and the other is defined in a root part of the end effector, and the detecting the deformation of the end effector includes comparing the assumed position of the detection part in the given direction when the detection part reaches the target part with the assumed position of the reference part in the given direction when the reference part reaches the target part to detect the deformation of the end effector.

17. The method of claim 14, wherein, the deformation of the end effector is rotational deformation of the end effector, one of the detection part and the reference part is defined in a root part of the end effector, and the other is defined in the tip-end part of the end effector or between the tip-end part and the root part of the end effector, and the detecting the deformation of the end effector includes comparing the assumed position of the detection part in a plane perpendicular to the given direction when the detection part reaches the target part with the assumed position of the reference part in the plane perpendicular to the given direction when the reference part reaches the target part to detect the deformation of the end effector.

18. The method of claim 10, wherein the reference position is the assumed position of the detection part in the given direction that is not deformed, when the target part is searched while the non-deformed detection part of the end effector touches the target pin, and the non-deformed detection part reaching the target part is detected based on the indicate function of the target part.

* * * * *